United States Patent
Kim et al.

(10) Patent No.: US 9,123,816 B2
(45) Date of Patent: Sep. 1, 2015

(54) THIN FILM TRANSISTOR ARRAY SUBSTRATE, ORGANIC LIGHT-EMITTING DISPLAY DEVICE INCLUDING THE SAME, AND METHOD OF MANUFACTURING THE ORGANIC LIGHT-EMITTING DISPLAY DEVICE

(71) Applicant: SAMSUNG DISPLAY CO., LTD., Giheung-Gu (KR)

(72) Inventors: Jong-Yun Kim, Yongin (KR); Myoung-Gu Lee, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 13/957,379

(22) Filed: Aug. 1, 2013

(65) Prior Publication Data
US 2014/0299842 A1 Oct. 9, 2014

(30) Foreign Application Priority Data
Apr. 4, 2013 (KR) .......................... 10-2013-0036981

(51) Int. Cl.
| | |
|---|---|
| H01L 29/08 | (2006.01) |
| H01L 35/24 | (2006.01) |
| H01L 51/00 | (2006.01) |
| H01L 29/786 | (2006.01) |
| H01L 27/32 | (2006.01) |
| H01L 27/12 | (2006.01) |

(52) U.S. Cl.
CPC ...... *H01L 29/78678* (2013.01); *H01L 27/1251* (2013.01); *H01L 27/1255* (2013.01); *H01L 27/3262* (2013.01); *H01L 27/3265* (2013.01)

(58) Field of Classification Search
CPC .............................. H01L 27/00; H01L 29/00
USPC ..................................................... 257/40, 72
See application file for complete search history.

(56) References Cited

U.S. PATENT DOCUMENTS

| | | | |
|---|---|---|---|
| 5,903,493 A | 5/1999 | Lee | |
| 7,450,100 B2 | 11/2008 | Koo et al. | |
| 7,692,191 B2 * | 4/2010 | Kwak et al. | 257/59 |
| 8,241,980 B2 * | 8/2012 | Miyazaki et al. | 438/240 |
| 8,466,021 B2 * | 6/2013 | Miyazaki et al. | 438/240 |
| 8,779,416 B2 * | 7/2014 | Kim | 257/40 |
| 2009/0262270 A1 * | 10/2009 | Kim et al. | 349/39 |
| 2010/0001372 A1 * | 1/2010 | Miyazaki et al. | 257/532 |
| 2011/0198584 A1 * | 8/2011 | Yang et al. | 257/43 |
| 2012/0288965 A1 * | 11/2012 | Miyazaki et al. | 438/3 |
| 2013/0207117 A1 * | 8/2013 | An et al. | 257/71 |
| 2013/0334508 A1 * | 12/2013 | Moon | 257/40 |
| 2014/0001445 A1 * | 1/2014 | Kim | 257/40 |
| 2014/0054562 A1 * | 2/2014 | Lee | 257/40 |

FOREIGN PATENT DOCUMENTS

| | | | | |
|---|---|---|---|---|
| KR | 1999-029975 A | 4/1999 | | |
| KR | 10-0543004 B1 | 1/2006 | | |
| KR | 10-2011-0071698 | * | 6/2011 | ............. H01L 51/52 |
| KR | 10-2011-0071698 A | 6/2011 | | |

* cited by examiner

*Primary Examiner* — Telly Green
(74) *Attorney, Agent, or Firm* — Christie, Parker & Hale, LLP

(57) ABSTRACT

A thin film transistor (TFT) array substrate including a first element layer on the substrate including a first TFT, a first planarization layer configured to cover the first element layer, and a second element layer on the first planarization layer including a capacitor.

19 Claims, 4 Drawing Sheets

THIN FILM TRANSISTOR ARRAY SUBSTRATE, ORGANIC LIGHT-EMITTING DISPLAY DEVICE INCLUDING THE SAME, AND METHOD OF MANUFACTURING THE ORGANIC LIGHT-EMITTING DISPLAY DEVICE

CROSS-REFERENCE TO RELATED APPLICATION

This application claims priority to and the benefit of Korean Patent Application No. 10-2013-0036981, filed on Apr. 4, 2013, in the Korean Intellectual Property Office, the disclosure of which is incorporated herein in its entirety by reference.

BACKGROUND

1. Field

The present invention relates to a thin film transistor (TFT) array substrate including a TFT and a capacitor, an organic light-emitting display device including the TFT array substrate, and a method of manufacturing the organic light-emitting display device.

2. Description of the Related Art

Recently, organic light-emitting display devices have garnered much attention as suitable display devices for displaying images.

The organic light-emitting display device is a self-emissive display device. Because the organic light-emitting display device does not require an additional light source unlike a liquid crystal display (LCD) device, a thickness and weight of the organic light-emitting display device may be reduced. Also, the organic light-emitting display device has advanced characteristics such as low power consumption, high luminance, high reaction rate, and the like.

In general, the organic light-emitting display device includes, on a substrate, gate lines extended in one direction, data lines extended in a direction crossing the gate lines, a pixel circuit electrically coupled to (e.g., connected to) each of the gate lines and the data lines, and an organic light-emitting diode (OLED) electrically coupled to the pixel circuit.

However recently, due to a demand for high-resolution displays, numbers of TFTs, capacitors, and OLEDs in the organic light-emitting display device are increased, and various problems such as overall arrangement of elements occur.

SUMMARY

Aspects of the present invention are directed to providing a thin film transistor (TFT) array substrate that is contributed to improving display quality, an organic light-emitting display device including the TFT array substrate, and a method of manufacturing the organic light-emitting display device.

According to an aspect of the present invention, there is provided a thin film transistor (TFT) array substrate including: a first element layer on the substrate including a first TFT; a first planarization layer configured to cover the first element layer; and a second element layer on the first planarization layer including a capacitor.

The TFT array substrate may further include a second planarization layer configured to cover the second element layer; and a third element layer on the second planarization layer including a second TFT.

At least parts of the first element layer, second element layer, and third element layer may be overlapped.

The first TFT and the second TFT may be of different types.

The first TFT may include a low-temperature polysilicon TFT (LTPS TFT) and the second TFT includes an oxide TFT.

According to another aspect of the present invention, there is provided an organic light-emitting display device including: a substrate; a first element layer on the substrate and including a first thin film transistor (TFT); a first planarization layer on the first element layer; a second element layer on the first planarization layer and including a capacitor; and an organic light-emitting diode (OLED) on the second element layer and configured to be insulated from the second element layer.

The organic light-emitting display device may further include: a second planarization layer on the second element layer; a third element layer on the second planarization layer and including a second TFT; and a third planarization layer on the third element layer, wherein the second planarization layer, the third element layer, and the third planarization layer are between the second element and OLED.

At least parts of the first element layer, second element layer, and third element layer may be overlapped.

The first TFT and the second TFT may be of different types.

The first TFT includes an LTPS TFT and the second TFT may include an oxide TFT.

The organic light-emitting display device may further include an initializing power line and a driving power line, wherein the second element layer includes a first capacitor, the first capacitor including: a first lower electrode on the first planarization layer and is coupled to the initializing power line; a first dielectric layer on the first lower electrode; and a first upper electrode on the first dielectric layer above the first lower electrode and is coupled to the driving power line.

The first element layer includes a first TFT, the first TFT may include: a first active layer on the substrate; a first gate electrode coupled to the first lower electrode, and insulated from the first active layer by a first gate insulating layer; a first source electrode insulated from the first gate electrode by the first interlayer insulating layer and coupled to the driving power line; and a first drain electrode on a same layer as the first source electrode and coupled to the OLED.

The organic light-emitting display device may further include a first scan line and a data line, wherein the third element layer includes a second TFT, the second TFT including: a second active layer on the second planarization layer; a second gate electrode that is coupled to the first scan line and insulated from the second active layer by a second gate insulating layer; a second source electrode insulated from the second gate electrode by the second interlayer insulating layer and coupled to the data line; and a second drain electrode on the same layer as the second source electrode and is coupled to the first source electrode.

The organic light-emitting display device may further include a first scan line and a data line, wherein, the third element layer includes the second TFT, the second TFT including: a second gate electrode on the second planarization layer and is coupled to the first scan line; a second active layer insulated from the second gate electrode by the second gate insulating layer; a second source electrode configured to contact the second active layer and to couple to the data line; and a second drain electrode on the same layer as the second source electrode and coupled to the first source electrode.

The first element layer may include a third TFT, the third TFT including: a third active layer on the same layer as the first active layer; a third gate electrode on the same layer as the first gate electrode and coupled to the first scan line; a third source electrode on the same layer as the first drain electrode and coupled to the first TFT; and a third drain electrode the same layer as the first drain electrode and coupled to the first gate electrode.

The organic light-emitting display device may further include a second scan line, wherein the third element layer includes a fourth TFT, the fourth TFT including: a fourth gate electrode on a same layer as the second gate electrode and coupled to the second scan line; a fourth active layer on the same layer as the second active layer; a fourth source electrode on the same layer as the second drain electrode and coupled to the initializing power line; and a fourth drain electrode on the same layer as the first drain electrode and coupled to the first gate electrode.

The organic light-emitting display device may further include an emission control line, wherein the first element layer includes a fifth TFT, the fifth TFT including: a fifth active layer on the same layer as the first active layer; a fifth gate electrode on the same layer as the first gate electrode and coupled to the emission control line; a fifth source electrode on the same layer as the first drain electrode and coupled to the driving power line; and a fifth drain electrode on the same layer as the first source electrode and coupled to the first TFT.

The third element layer may include a sixth TFT, the sixth TFT including: a sixth gate electrode on the same layer as the second gate electrode and coupled to the emission control line; a sixth active layer on the same layer as the second active layer; a sixth source electrode on the same layer as the first drain electrode and coupled to the first TFT; and a sixth drain electrode on the same layer as the first drain electrode and coupled to the OLED.

The second element layer may include a second capacitor, the second capacitor including: a second lower electrode on the first planarization layer and coupled to the first gate electrode; and a second upper electrode on the first dielectric layer and configured to correspond to the second lower electrode and to be coupled to the first scan line.

According to another aspect of the present invention, there is provided a method of manufacturing an organic light-emitting apparatus, the method including: forming a first element layer including a first thin film transistor (TFT) on a substrate; forming a first planarization layer to cover the first element layer; forming a second element layer including a capacitor on the first planarization layer; and forming an organic light-emitting diode (OLED) on the second element layer to be insulated from the second element layer.

The method may further include: forming a second planarization layer to cover the second element layer; forming a third element layer including a second TFT on the second planarization layer; and forming a third planarization layer to cover the third element layer, wherein the second planarization layer, the third element layer, and the third planarization layer are between the second element layer and the OLED.

At least parts of the first element layer, second element layer, and third element layer may overlap.

The first TFT and the second TFT may be of different types.

The first TFT may include a low-temperature polysilicon TFT (LTPS TFT) and the second TFT may include an oxide TFT.

BRIEF DESCRIPTION OF THE DRAWINGS

The above and other features and aspects of the present invention will become more apparent by describing in detail example embodiments thereof with reference to the attached drawings in which.

DETAILED DESCRIPTION

Figure 1:
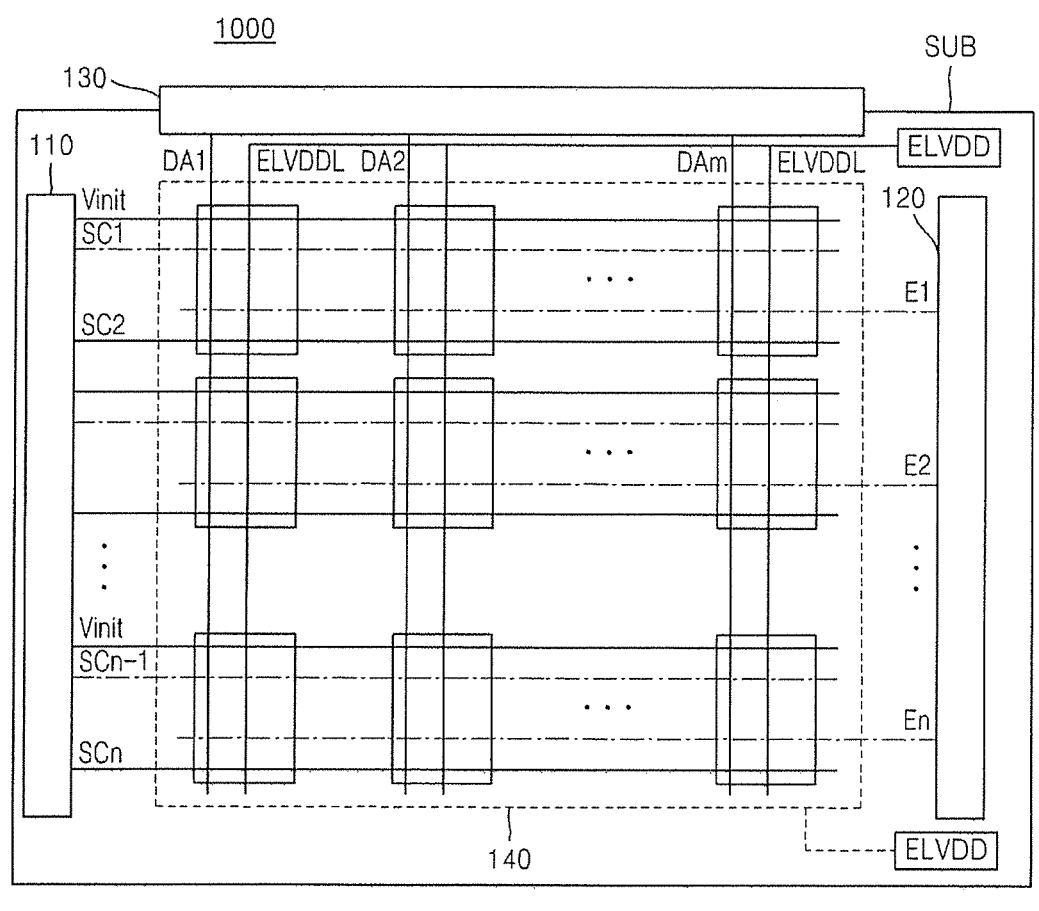
FIG. 1 is a block diagram of an organic light-emitting display device, according to an example embodiment of the present invention.
Figure 1:
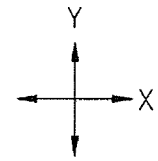

Hereinafter, as the invention allows for various changes and numerous embodiments, particular embodiments will be illustrated in the drawings and described in detail in the written description. However, this is not intended to limit the present invention to particular modes of practice.

In order to clearly describe the present invention, explanations unrelated to the description are omitted when it is deemed that they may unnecessarily obscure the essence of the invention. Also, it is to be appreciated that identical or similar features throughout the entire specification are identified by the same reference identification numbers.

In regard to example embodiments of the present invention, Example 1 is representatively described using the same identification numbers in terms of features with the same configuration in various example embodiments of the present invention. In other example embodiments of the present invention, only parts of a configuration that are different from Example 1 will be described.

In the following description, sizes and thicknesses of each configuration in the drawings are provided only as examples, and the present embodiments are not limited thereto.

For the convenience of description, thicknesses of some multiple layers and regions in the drawings are exaggerated. It will be understood that when an element such as a layer, a film, a region, or a plate is referred to as being "on" another element, it can be directly on the other element or intervening elements can be present.

In addition, in the present specification, it is to be understood that the terms "includes," "including," "comprises," or "comprising" are intended to indicate the existence of other features rather than to exclude them unless it has a clearly different meaning in the context. In the present specification, the term "on" refers to a position above or below a target element, and thus it is not necessarily limited to a position on the upper side with respect to the direction of gravity.

As an example, in the attached drawings, an active matrix (AM) organic light-emitting display (OLED) device having a six-transistor-two cap (6Tr-2Cap) structure consisting of six thin film transistors (TFTs) and two capacitors provided in one pixel is illustrated, but the present invention is not limited thereto. Therefore, the organic light-emitting display device may have a plurality of TFTs and one or more capacitors in one pixel. The organic light-emitting display device may be formed to have various structures by forming an additional line or omitting an existing line. Here, a pixel represents the smallest unit to display an image, and an organic light-emitting display device displays an image via a plurality of pixels.

Hereinafter, an organic light-emitting display device, according to an embodiment of the present invention, will be described in detail with reference to FIGS. 1 through 3

FIG. 1 is a schematic view of an organic light-emitting display device, according to an embodiment of the present invention.

Figure 2:
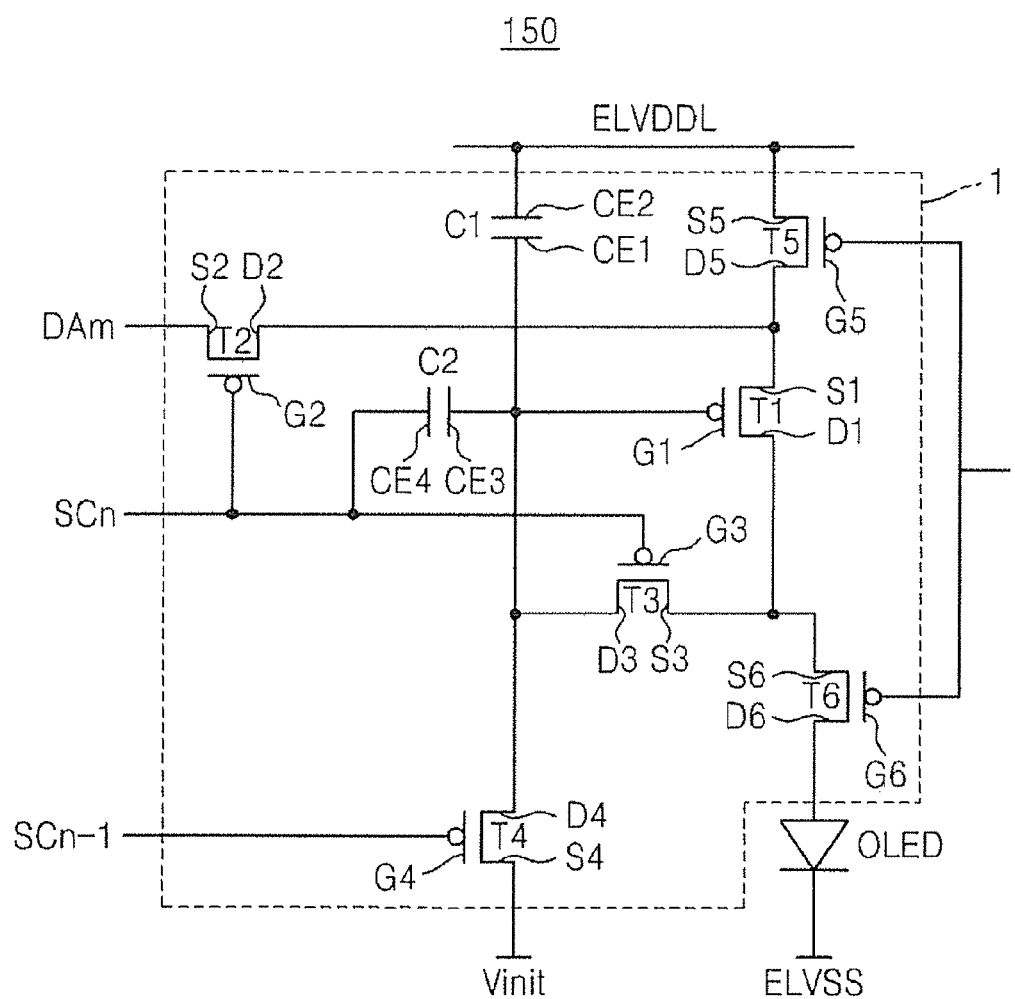
FIG. 2 is a circuit diagram of a pixel shown in FIG. 1, according to an example embodiment of the present invention.

As shown in FIG. 1, the organic light-emitting display device 1000, according to an embodiment of the present invention, includes a gate driving unit 110, an emission control driving unit 120, a data driving unit 130, various lines (e.g., power, control, and data lines), a display unit 140, and a pixel 150 (see FIG. 2).

In response to a control signal supplied from an external control circuit, for example, a timing control unit and the like, the gate driving unit 110 sequentially supplies scan signals to first scan lines SC2-SCn or second scan lines SC1-SCn-1. Then, the pixel 150 is selected by the scan signals and is subsequently supplied with data signals.

The second scan line SCn-1 is coupled to (e.g., connected to) the gate driving unit 110 and a scan signal from the gate driving unit 110 is supplied through the second scan line SCn-1. An emission control line En is coupled to the emission control driving unit 120, and an emission control signal from the emission control driving unit 120 is supplied through the emission control line En.

The first scan line SCn is coupled to the gate driving unit 110 and a scan signal from the gate driving unit 110 is supplied through the first scan line SCn. The initializing power line Vinit is coupled to the gate driving unit 110 and an initializing power from the gate driving unit 110 is supplied through initializing power line Vinit.

Although in the present embodiment, the initializing power from the gate driving unit 110 is supplied through the initializing power line Vinit, in other embodiments of the present invention, the initializing power line Vinit is coupled to other additional components and thus the initializing power may be applied from the additional components.

The emission control driving unit 120 sequentially supplies emission control signals through the emission control line En in response to the control signal supplied from the external timing control unit. Then, the light emission of the pixel 150 is controlled by the emission control signal.

That is, the emission control signal controls an emission time of the pixel 150. However, the emission control driving unit 120 may be omitted depending on the internal structure of the pixel 150.

The data driving unit 130 supplies a data signal through a data line DAm in response to the control signal supplied from the external timing control unit. The data signal supplied through the data line DAm is supplied to the selected pixel 150 whenever the scan signal is supplied through the first scan line SCn. Then, the pixel 150 charges a voltage corresponding to the data signal, and accordingly emits light at a luminance corresponding to the charged voltage.

The data lines DA1-DAm and driving power line ELVDDL are extended to a second direction Y crossing a first direction X. The data line DAm is coupled to the data driving unit 130 and a data signal from the data driving unit 130 is supplied through the data line DAm. The driving power line ELVDDL is coupled to an external first power source ELVDD, which will be described later, and driving power from the first power source ELVDD is supplied through the driving power line EVLDDL.

The display unit 140 includes a plurality of the pixels 150 that are respectively positioned at the crossings of the first scan lines SCn, the second scan lines SCn-1, and data lines DAm. Here, each of the pixels 150 includes an OLED and a pixel circuit, in which the OLED emits light at a luminance corresponding to a driving current in response to the data signal, and the pixel circuit controls the driving current flowing in the OLED. The pixel circuit is coupled to (e.g., connected to) each of the first scan lines SCn, the second scan lines SCn-1, the initializing power lines, the emission control lines, the driving power lines, and the data lines, whereas the OLED is coupled to the pixel circuit.

In the display unit 140, the OLED is coupled to the external power sources such as the first power source ELVDD and the second power source ELVSS with the pixel circuit interposed therebetween. The first power source ELVDD and the second power source ELVSS supply driving power and common power, respectively, to each of the pixels 150 in the display unit 140. The pixels 150 emit light at a luminance corresponding to the driving current that flows through the pixels 150 from the first power ELVDD in response to the data signal, the driving current being in accordance with the supplied driving power and the common power.

Hereinafter, the pixel 150, according to an embodiment of the present invention, will be described in detail with reference to FIGS. 2 and 3.

FIG. 2 is a circuit diagram of the pixel 150 shown in FIG. 1. FIG. 3 is a cross-sectional view of a pixel circuit 152 and the OLED shown in FIG. 2.

Figure 3:
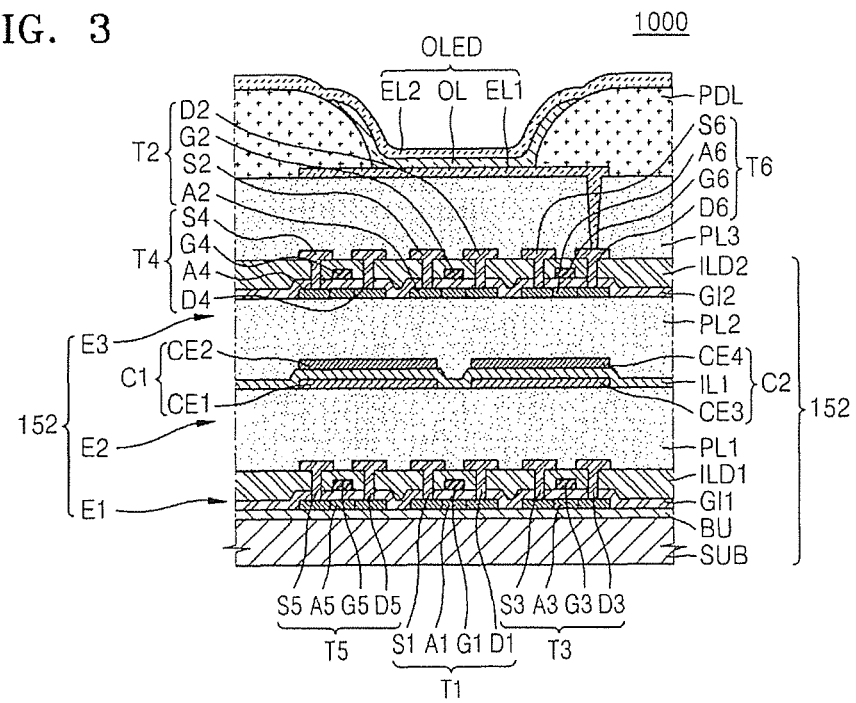
FIG. 3 is a cross-sectional view of a pixel circuit and an organic light-emitting diode (OLED) shown in FIG. 2, according to an example embodiment of the present invention.

As shown in FIGS. 2 and 3, the pixel 150 includes the OLED that is coupled between the first power source ELVDD and the second power source ELVSS, and the pixel circuit 152 that is coupled between the first power source ELVDD and the OLED and controls the driving power.

The pixel circuit 152 includes a first element layer E1 that is located (e.g., positioned or disposed) on a substrate SUB and includes a first TFT T1, a third TFT T3, and a fifth TFT T5, a second element layer E2 that is located on the first element layer E1 and includes a first capacitor C1 and a second capacitor C2, and a third element layer E3 that is located on the second element layer E2 and includes a second TFT T2, a fourth TFT T4, and a sixth TFT T6.

An anode electrode of the OLED is coupled to the driving power line ELVDDL via the pixel circuit 152, wherein the driving power line ELVDDL is coupled to the first power source ELVDD. A cathode electrode of the OLED is coupled to the second power source ELVSS. When receiving the driving power via the pixel circuit 152 from the first power source ELVDD, and the common power from the second power source ELVSS, the OLED emits light at a luminance corresponding to the driving current flowing in the OLED.

An area occupied by the capacitor that is included in the pixel circuit 152 is about 50% of the total area of the pixel circuit 152. Thus, when the capacitor and the TFT are located on the same plane, the area of the pixel circuit 152 increases. When the area of the pixel circuit 152 increases, an area of the pixel 150 also increases, and as a result, the number of the pixels to be formed on a limited substrate is reduced.

According to an embodiment of the present invention, the second element layer E2 including at least one capacitor is located at a different plane from the plane on which the first element layer E1 and third element layer E3, each including at least one TFT, are located. For example, the first element layer E1 and the second element layer E2 are separated from each other by a first planarization layer PL1, whereas the second element layer E2 and the third element layer E3 are separated from each other by a second planarization layer PL2. Also, at least some parts of the first element layer E1, second element layer E2, and third element layer E3 are overlapped with one another. For example, as shown in FIG. 3, the second element layer E2 is positioned to overlap the first element layer E1, and the third element layer E3 is positioned to overlap the second element layer E2. Thus, the first element layer E1, the second element layer E2, and the third element layer E3 are overlapped with one another. As elements included in the pixel circuit 152 are located to be overlapped, a number of elements may be embodied in a small area. Therefore, the areas of the pixel circuit 152 and the pixel 150 are decreased. Accordingly, the number of pixels to be located on the limited substrate SUB is increased, and thus high resolution of the organic light-emitting display device 1000 may be implemented.

Hereinafter, the elements positioned at the first element layer E1, the second element layer E2, and the third element layer E3 will be described in detail.

The first TFT T1 is located at the first element layer E1 and is coupled between the driving power line ELVDDL and the OLED. The driving power corresponding to the data signal is supplied from the first power source ELVDD to the OLED during the emission of the pixel 150. For example, the first TFT T1 may act as a driving transistor of the pixel 150. The first TFT T1 includes a first active layer A1, a first gate electrode G1, a first source electrode S1, and a first drain electrode D1.

The first active layer A1 contains polysilicon and includes a source region and a drain region that are doped with doping materials and a channel region between the source region and the drain region. The first active layer A1 is interposed between a buffer layer BU and the first gate insulating layer GI1, wherein the buffer layer is formed on the substrate SUB.

The first gate electrode G1 is coupled to a first lower electrode CE1 of the first capacitor C1 and is located on the first gate insulating layer GI1. For example, the first gate insulating layer GI1 is interposed between the first gate electrode G1 and the first active layer A1.

A first source electrode S1 is coupled to the driving power line ELVDDL via the fifth TFT T5. The first drain electrode D1 is coupled to the OLED via the sixth TFT T6. A first interlayer insulating layer ILD1 is interposed between the first gate electrode G1 and each of the first source electrode S1 and the first drain electrode D1.

The second TFT T2 is located at the third element layer E3 and is coupled between the data line DAm and the first TFT T1. When the scan signal is supplied from the second scan line SCn-1, the data signal supplied from the data line DAm is transmitted to the inside of the pixel 150. That is, the second TFT T2 may act as a switching transistor of the pixel 150. The second TFT T2 includes a second active layer A2, a second gate electrode G2, a second source electrode S2, and a second drain electrode D2.

The second active layer A2 contains polysilicon and includes a source region and a drain region that are doped with doping materials and a channel region between the source region and the drain region. The second active layer A2 is interposed between a second planarization layer PL2 and a second gate insulating layer GI2.

The second gate electrode G2 is coupled to the first scan line SCn, and the second gate insulating layer GI2 is interposed between the second gate electrode G2 and the second active layer A2.

The second source electrode S2 is coupled to the data line DAm, and the drain electrode D2 is coupled to the first source electrode S1 of the first TFT T1. A second interlayer insulating layer ILD2 is interposed between the second source electrode S2, the second drain electrode D2, and the second gate electrode G2.

The third TFT T3 is located at the first element layer E1 and is coupled between the first drain electrode D1 of the first TFT T1 and the first gate electrode G1. When the data signal is supplied to inside of the pixel 150, the third TFT T3 is coupled to a diode so as to compensate a threshold voltage of the first TFT T1. That is, the third TFT T3 may act as a compensating transistor of the pixel 150. The third TFT T3 includes a third active layer A3, a third gate electrode G3, a third source electrode S3, and a third drain electrode D3.

The third active layer A3 contains polysilicon and includes a source region and a drain region that are doped with doping materials and a channel region between the source region and the drain region. The third active layer A3 is interposed between the buffer layer BU and the first gate insulating layer GI1, wherein the buffer layer is formed on the substrate SUB.

The third gate electrode G3 is coupled to the first scan line SCn and is located at the same layer as the first gate electrode G1. For example, the first gate insulating layer GI1 is located between the third gate electrode G3 and the third active layer A3.

The third source electrode S3 is coupled to the first drain electrode D1 of the first TFT T1. The third drain electrode D3 is coupled to the first gate electrode G1 of the first TFT T1. The first interlayer insulating layer ILD1 is interposed between the third source electrode S3, the third drain electrode D3, and the third gate electrode G3.

The fourth TFT T4 is located at the third element layer E3 and is coupled between the initializing power line Vinit and the first gate electrode G1 of the first TFT T1. In order to supply the data signal to the inside of the pixel 150 during the data programming period (during which the data signal is input in the pixel 150), the initializing power is transmitted to the inside of the pixel 150 to initialize the first TFT T1 (in which the initializing power is supplied from the initializing power line Vinit when the scan signal is supplied from the second scan line SCn-1 prior to the data programming period). For example, the fourth TFT T4 may act as a switching transistor of the pixel 150. The fourth TFT T4 includes a fourth active layer A4, a fourth gate electrode G4, a fourth source electrode S4, and a fourth drain electrode D4.

The fourth active layer A4 contains polysilicon and includes a source region and a drain region doped with doping materials and a channel region between the source region and the drain region. The fourth active layer A4 is interposed between the second planarization layer PL2 and the second gate insulating layer GI2.

The fourth gate electrode G4 is coupled to the second scan line SCn-1 and is located at the same layer as the second gate electrode G2. For example, the second gate insulating layer GI2 is interposed between the fourth gate electrode G4 and the fourth active layer A4.

The fourth source electrode S4 is coupled to the initializing power line Vinit, and the fourth drain electrode D4 is coupled to the first gate electrode G1 of the first TFT T1. The second interlayer insulating layer ILD2 is interposed between the fourth source electrode S4, the fourth drain electrode D4, and the fourth gate electrode G4.

The fifth TFT T5 is located at the first element layer E1 and is coupled between the driving power line ELVDDL and the first TFT T1. During the non-light-emitting period in regard to the pixel 150, the coupling (or connection) between the first power ELVDD and the first TFT T1 is severed (or disconnected). On the contrary, during the light-emitting period in regard to the pixel 150, the first power source ELVDD and the first TFT T1 are electrically coupled to each other. For example, the fifth TFT T5 may act as a switching transistor of the pixel 150. The fifth TFT T5 includes a fifth active layer A5, a fifth gate electrode G5, a fifth source electrode S5, and a fifth drain electrode D5.

The fifth active layer A5 contains polysilicon and includes a source region and a drain region doped with doping materials and a channel region between the source region and the drain region. The fifth active layer A5 is interposed between the buffer layer BU and the first gate insulating layer GI1, wherein the buffer layer BU is formed on the substrate SUB.

The fifth gate electrode G5 is coupled to the emission control line En and is located at the same layer as the first gate electrode G1. That is, the first gate insulating layer GI1 is located between the fifth gate electrode G5 and the fifth active layer A5.

The fifth source electrode S5 is coupled to the driving power line ELVDDL, and the fifth drain electrode D5 is coupled to the first source electrode S1 of the first TFT T1. The first interlayer insulating layer ILD1 is located between the fifth source electrode S5, the fifth drain electrode D5, and the fifth gate electrode G5.

The sixth TFT T6 is located at the third element layer E3 and is coupled between the first TFT T1 and the OLED. During non-light-emitting period in regard to the pixel 150, the coupling (or connection) between first TFT T1 and the OLED is severed (or disconnected). On the contrary, during the light-emitting period in regard to the pixel 150, the first TFT T1 and the OLED are electrically coupled to each other. For example, the sixth TFT T6 may act as a switching transistor of the pixel 150. The sixth TFT T6 includes a sixth active layer A6, a sixth gate electrode G6, a sixth source electrode S6, and a sixth drain electrode D6.

The sixth active layer A6 contains polysilicon and includes a source region and a drain region doped with doping materials and a channel region between the source region and the drain region. The sixth active layer A6 is interposed between the second planarization layer PL2 and the second gate insulating layer GI2.

The sixth gate electrode G6 is coupled to the emission control line En and is located at the same layer as the second gate electrode. For example, the second gate insulating layer GI2 is located between the sixth gate electrode G6 and the sixth active layer A6.

The sixth source electrode S6 is coupled to the first drain electrode D1 of the first TFT T1. The sixth drain electrode D6 is coupled to an anode electrode of the OLED. The second interlayer insulating layer ILD2 is interposed between the sixth source electrode S6, the sixth drain electrode D6, and the sixth gate electrode G6.

At least one of the first TFT T1 to the sixth TFT T6 may have the source electrode and the drain electrode selectively located at the same layer as the active layer of the corresponding TFT. For example, the source electrode and the drain electrode of each of the TFTs may be selectively formed of polysilicon that is doped with the doping materials.

The first capacitor C1 is located at the second element layer E2 and is provided to store the data signal supplied to inside of the pixel 150 during the data programming period pixel 150 and to maintain the signal during one frame. Accordingly, the first capacitor C1 is coupled to the driving power line ELVDDL and the first gate electrode G1 of the first TFT T1, in which the driving power line ELVDDL is coupled to the first power source ELVDD and the first gate electrode G1 of the first TFT T1 is coupled to the initializing power line Vinit. For example, the first capacitor C1 may act as a storage capacitor. The first capacitor C1 includes a first lower electrode CE1 and a first upper electrode CE2.

The first lower electrode CE1 is coupled to the first gate electrode G1 of the first TFT T1 that is coupled to the initializing power line Vinit, and is located on the first planarization layer PL1.

The first upper electrode CE2 is coupled to the driving power line ELVDDL and is positioned corresponding to the first lower electrode on a first dielectric layer that is formed on the first lower electrode. For example, a first dielectric layer IL1 is interposed between the first lower electrode CE1 and the first upper electrode CE2.

The second capacitor C2 is located at the second element layer E2, and, in order to compensate for the voltage drop due to the load on the organic light-emitting display device 1000, the second capacitor C2 is coupled between the first lower electrode CE1 of the first capacitor C1 and the first scan line SCn. When the voltage level of the scan signal is changed, such as when the supply of the current scan signal is interrupted, the second capacitor C2 increases the voltage of the first gate electrode G1 of the first TFT T1 due to a coupling effect so as to act as a boosting capacitor that compensate for the voltage drop. The second capacitor C2 includes a second lower electrode CE3 and a second upper electrode CE4.

The second lower electrode CE3 is coupled to the first lower electrode CE1 of the first capacitor C1, and is located on the first planarization layer PL1.

The second upper electrode CE4 is coupled to the first scan line SCn and is positioned to correspond to second lower electrode CE3 on the first dielectric layer IL1, which is formed on the second lower electrode CE3. That is, the first dielectric layer IL1 is interposed between the second lower electrode CE3 and the second upper electrode CE4.

In regard to the sixth drain electrode D6 of the sixth TFT T6, the OLED is coupled to the sixth drain electrode D6.

The OLED includes an anode electrode EL1 that is disposed on the third planarization layer PL3 and coupled to the sixth drain electrode D6, an organic emission layer PL formed in an opening that is defined as a pixel defining layer PDL on the anode electrode, and a cathode electrode EL2 that is formed on the organic emission layer and coupled to the second power ELVSS corresponding to the anode electrode. The organic emission layer OL may be determined to be disposed by the pixel defining layer PDL, whereas the cathode electrode EL2 may be disposed throughout the entire surface of the pixel defining layer PDL.

Hereinafter, an operation of the pixel 150 will be described.

First, during a first period set as an initialization period, a previous scan signal of a low level is supplied through the second scan line SCn-1. Then, in response to the previous scan signal of the low level, the fourth TFT T4 is turned on, and the initial power is supplied to the first TFT T1 via the fourth TFT T4 from the initializing power line Vinit. Thus, the first TFT T1 is initialized.

Next, during a second period set as a data programming period, a current scan signal of a low level is supplied through the first scan line SCn. Then, in response to the current scan signal of a low level, the second TFT T2 and the third TFT T3 are turned on.

Then, the first TFT T1 is also turned on by the third TFT T3 as being coupled to the diodes. In particular, during the previous first period, because the first TFT T1 is initialized, the first TFT T1 is coupled to the diodes in the forward direction.

Accordingly, the data signal supplied from the data line DAm passes through the second TFT T2, the first TFT T1, and the third TFT T3, and thus a current corresponding to a difference between a voltage of the data signal and a threshold voltage of the first TFT T1 is stored in the first capacitor C1.

Thereafter, when the supply of the current scan signal is interrupted and the voltage level of the current scan signal is changed to a high level, due to the coupling effect of the second capacitor C2, the voltage applied to the first gate electrode G1 of the first TFT T1 is changed in response to the range of the voltage fluctuation. Here, the voltage applied to the first gate electrode G1 of the first TFT T1 is changed due to a charge sharing between the first capacitor C1 and second capacitor C2, and accordingly, the voltage applied to the first gate electrode G1 is proportionally changed to a value of the charge sharing between the first capacitor C1 and the second capacitor C2, along with the range of the voltage fluctuation of the current scan signal.

Next, during a third period set as an emission period, an emission control signal supplied from the emission control line En is changed from a high level to a low level. Then, during the third period, the fifth TFT T5 and the sixth TFT T6 are turned on by the emission control signal of a low level. Accordingly, a driving current flows to the second power ELVSS via the fifth TFT T5, the first TFT T1, the sixth TFT T6, and the OLED, through the driving power line ELVDDL from the first power ELVDD.

The driving current is controlled by the first TFT T1, and the first TFT T1 generates a driving current corresponding to the voltage supplied to the first gate electrode G1 thereof. Here, during the above-described second period, a current reflecting the threshold voltage of the first TFT T1 is stored in the first capacitor C1. Thus, during the third period, the voltage threshold of the first TFT T1 is compensated.

Hereinafter, an organic light-emitting display device shown in FIG. 3 will be briefly described.

First, a buffer layer BU is formed on a substrate SUB, and a first element layer E1 including at least one TFT is manufactured.

All of the first TFT T1, the third TFT T3, and the fifth TFT T5 that are included in the first element layer E1 include an active layer that contains silicon. Thus, amorphous silicon is formed on the substrate SUB, and then the amorphous silicon is annealed to form polysilicon by a low-temperature polysilicon (LTPS) process. The first active layers A1, third active layers A3, and fifth active layers A5 are formed by patterning the polysilicon.

Next, a layer such as a first gate insulating layer GI1 including silicon nitride and/or silicon oxide to cover the first, second, and third active layers A1, A3, and A5 is formed.

On the first gate insulating layer GI1, a first gate electrode G1, a third gate electrode G3, and a fifth gate electrode G5 are formed to correspond to each of the first active layer A1, the third active layer A3, and the fifth active layer A5. Then, each of the first gate electrode G1, the third gate electrode G3, and the fifth gate electrode G5 is self-align masked to form a source region and a drain region by doping edges of each of the first active layer A1, the third active layer A3, and the fifth active layer A5.

Next, a first interlayer insulating layer ILD1 is formed to cover the first gate electrode G1, the third gate electrode G3, and the fifth gate electrode G5. Then, contact holes are formed in a portion of the first gate insulating layer GI1 and the first interlayer insulating layer ILD1 active layer, which corresponds to each of the source region and the drain region.

Next, in order to contact with the source region and the drain region of the first active layer A1 through the contact holes, a first source electrode S1 and a first drain electrode D1 are formed on the first interlayer insulating layer ILD1. The third source electrode S3, the third drain electrode D3, the fifth source electrode S5, and the fifth drain electrode D5 are formed in the same manner. As a result, the first TFT T1, the third TFT T3, and the fifth TFT T5 that are included in the first element layer E1 are manufactured.

Next, a first planarization layer PL1 is formed to cover the first TFT T1, the third TFT T3, and the fifth TFT T5. The first planarization layer PL1 may be formed by coating organic and/or inorganic materials, and in some embodiments, it is formed thick to have a planarized upper surface.

Next, a second element layer E2 is formed on the first planarization layer PL1. For example, a first lower electrode CE1 and a second lower electrode CE3 are formed on the first planarization layer PL1. Then, the first dielectric layer IL1 is formed to cover the first lower electrode CE1 and the second lower electrode CE3. Next, a first upper electrode CE2 and a second upper electrode CE4 are formed on the first dielectric layer IL1 to correspond to the first lower electrode CE1 and the second lower electrode CE3, respectively. Thus, the first capacitor C1, including the first lower electrode CE1 and the first upper electrode CE2, and the second capacitor C2, including the lower electrode CE3 and the second upper electrode CE4, are manufactured.

Next, a second planarization layer PL2 is formed to cover the first capacitor C1 and the second capacitor C2. The second planarization layer PL2 may be formed by coating organic and/or inorganic materials, and in most cases, it is formed thick to have a planarized upper surface. The second planarization layer PL2 may be formed of the same materials of the first planarization layer PL1.

A third element layer E3 including at least one TFT is manufactured on the second planarization layer PL2.

After forming polysilicon entirely on the second planarization layer PL2 as described above, the second active layer A2, the fourth active layer A4, and sixth active layer A6 are formed by patterning the polysilicon.

After the second gate insulating layer GI2 is formed on the active layer in a similar way to the first element layer E1, the gate electrode is formed. Then, the second interlayer insulating layer ILD2 is formed on the gate electrode, and the source electrode and the drain electrode are formed, thereby manufacturing the second TFT T2, the fourth TFT T4, and the sixth TFT T6.

A third planarization layer PL3 is formed on the third element layer E3, and an OLED is formed.

Hereinafter, an OLED, according to another embodiment of the present invention, will be described in detail with reference to FIG. 4.

Figure 4:
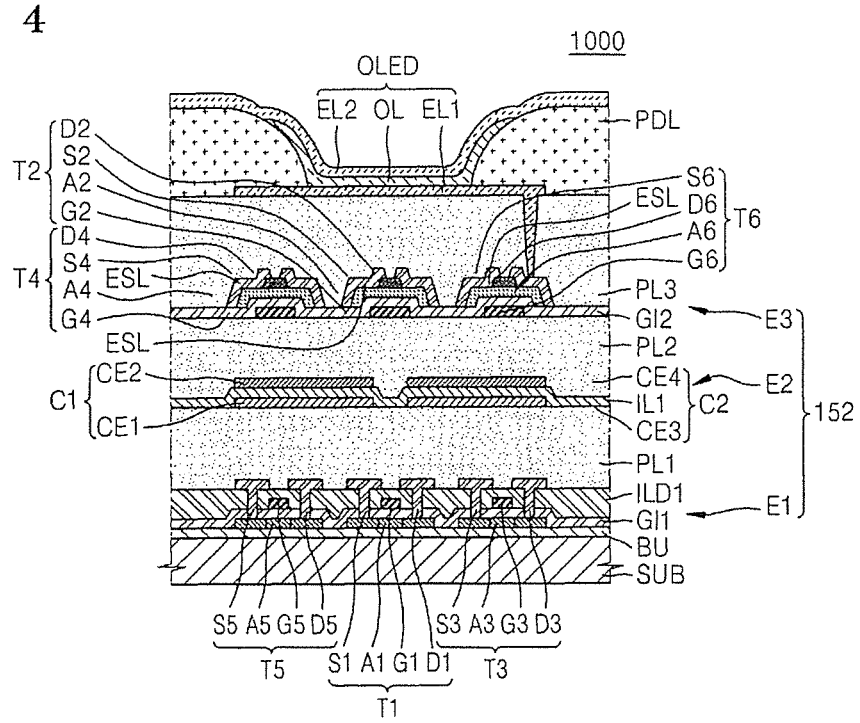
FIG. 4 is a cross-sectional view of a pixel circuit and an OLED in an organic light-emitting display device, according to another example embodiment of the present invention.

FIG. 4 is a cross-sectional view of the organic light-emitting display device, according to another embodiment of the present invention.

Hereinafter, only those characteristics that are different from the embodiment of FIG. 1 will be described, and parts not described will be in accordance with the embodiment of FIG. 1 of the present invention. In addition, for the convenience of description, the embodiment of FIG. 4 will be described using the same reference numbers as the embodiment of FIG. 1 in regard to the same components.

According to the embodiment of FIG. 4, the TFTs included in the first element layer E1 (i.e., the first TFT T1, the third TFT T3, and the fifth TFT T5) and the TFTs included in the third element layer E3 (i.e., the second TFT T2, the fourth TFT T4, and the sixth TFT T6) may be different from each other.

For example, the first TFT T1, the third TFT T3, and the fifth TFT T5 may be LTPS-TFTs, whereas the second TFT T2, the fourth TFT T4, and the sixth TFT T6 may be oxide-TFTs. In other words, the TFTs included in the first element layer E1 may contain polysilicon in the active layer, whereas the TFTs included in the third element layer E3 may contain oxide-semiconductor in the active layer.

After forming the amorphous silicon on the buffer layer BU, the polysilicon is formed by the annealing process of LTPS at a temperature of 300° C. or more. In case of the first element layer E1, the polysilicon is formed directly on the substrate SUB, and thus the LTPS TFT may be manufactured if the substrate SUB can withstand the temperature of 300° C. or more. However, in case of the third element layer E3, various elements including the first element layer E1 and second element layer E2 are positioned below the third element layer E3, and thus the elements may be damaged during the LTPS process. Therefore, the third element layer E3 is better suited to using oxide TFTs that do not require an annealing process.

Each of the first TFT T1 to sixth TFT T6 in the organic light-emitting display device 1000, according to Example 1 of the present invention, is provided as a top gate type. However, according to an Example 2 embodiment of the present invention, each of the second TFT T2, fourth TFT T4, and sixth TFT T6 in the organic light-emitting display device 1000 is a bottom gate type and is an oxide TFT as shown in FIG. 4, and each of the first TFT T1, third TFT T3, and fifth TFT T5 is a top gate type and is a LTPS TFT.

The second active layer A2, the fourth active layer A4, and the sixth active layer A6, which are included in the second TFT T2, fourth TFT T4, and sixth TFT T6, respectively, include oxide semiconductors. For example, the active layers may include a layer of GIZO (indium gallium zinc oxide) and/or oxides of materials selected from the group consisting of metal elements such as zinc (Zn), indium (In), gallium (Ga), tin (Sn), cadmium (Cd), germanium (Ge), and hafnium (Hf) of Groups 12, 13, and 14 of the periodic table and a combination thereof.

In one embodiment, when manufacturing the third element layer E3, the second gate electrode G2, fourth gate electrode G4, and sixth gate electrode G6 are formed on the second planarization layer PL2, and then the second gate insulating layer GI2 is formed to entirely cover the gate electrodes.

Next, after forming and patterning oxide semiconductors on the second gate insulating layer GI2, the second active layer A2, fourth active layer A4, and sixth active layer A6 are formed.

Then, an etch stop layer consisting of silicon oxide is formed on each active layer as needed. Then, the source electrode and drain electrode are formed to contact with edges of each active layer, and thus, the second TFT T2, fourth TFT T4, and sixth TFT T6 are manufactured.

Hereinafter, an organic light-emitting display device according to an Example 3 embodiment of the present invention will be described in detail.

Figure 5:
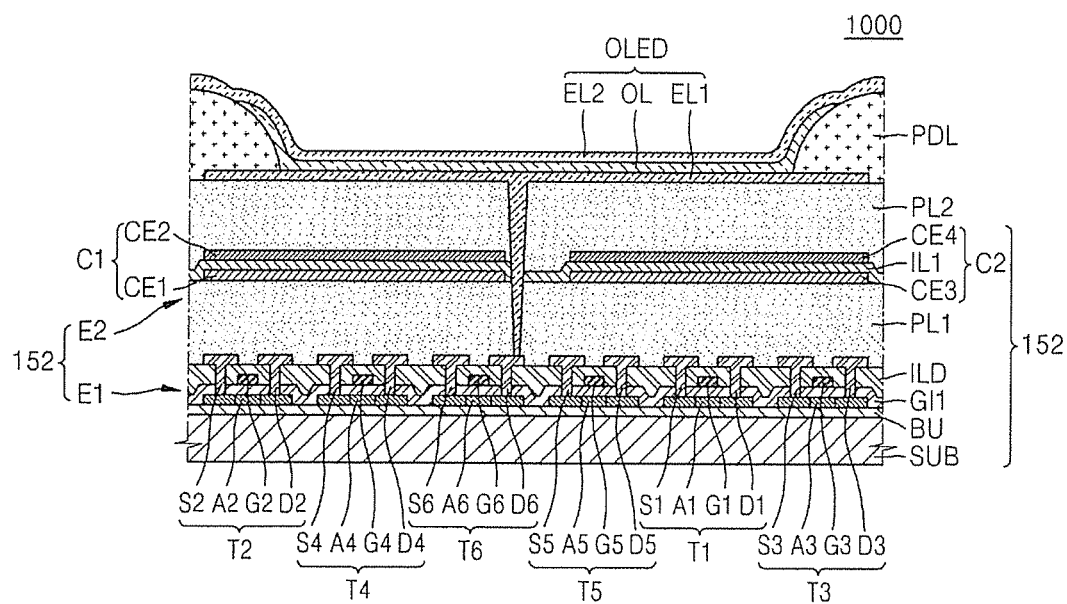
FIG. 5 is a cross-sectional view of a pixel circuit and an OLED in an organic light-emitting display device, according to another example embodiment of the present invention.

FIG. 5 is a cross-sectional view of the organic light-emitting display device according to Example 3 of the present invention.

Hereinafter, only characteristics that are different from the Example 1 embodiment of the present invention will be described, and any part of the description that is not provided is in accordance with Example 1 of the present invention. In addition, for the convenience of description, Example 3 of the present invention will be described using the same reference numbers as Example 1 in regard to the same components.

As shown in FIG. 5, the pixel circuit 152 is disposed on the substrate SUB and includes the first element layer E1 that includes TFTs from the first TFT T1 to sixth TFT T6 and the second element layer E2 that is formed on the first element layer E1 and includes the first capacitor C1 and the second capacitor C2.

In Example 3, in order to provide numbers of the elements in a small area, the first element layer E1 including the TFTs and the second element layer E2 including the capacitor are also disposed on different planes. For instance, the first element layer E1 and the second element layer E2 are separated from each other across the first planarization layer PL1, and at least some parts of the first element layer E1 and the second element layer E2 are overlapped.

However, unlike Example 1 of the present invention, the TFTs are not separated and located on different planes. Therefore, in Example 3 of the present invention, the TFTs may be of the same type. For example, all the TFTs from the first TFT T1 to sixth TFT T6 may be LTPS TFTs having polysilicon as the active layer.

The operations of the elements located at the first element layer E1 and second element layer E2, and the components of the pixel circuit 152 have been described in detail with regards to Example 1 and their description will not be repeated.

Although a network of each TFT and the capacitors is not entirely shown in FIGS. 3 to 5, the additional formation of contact holes and wires connected to the contact holes for the connection between each element during the formation of the entire layout of the pixels would be obvious to one of ordinary skill in the art.

Meanwhile, according to an embodiment of the present invention, the pixel circuit of FIGS. 3 to 5 is described based on the organic light-emitting display device, but it is not limited thereto. For example, the TFT array substrate including the pixel circuit of FIGS. 3 to 5 may be employed in a liquid crystal display (LCD) apparatus.

Referring to FIGS. 3 to 5, examples of the formation of separate organic emission layer by each pixel are described. Here, the organic emission layer emits red, green, and blue light separately by pixel, and a group of the pixel emitting the red, green, and blue light may form a single pixel unit. However, the organic emission layer is not limited thereto, and may be formed entirely on the pixel in common. For example, a plurality of the organic emission layer emitting red, green, and blue light may be laminated vertically or mixed each with other to emit white light. Here, the color combination to emit white light is not limited to the aforementioned description, and a color conversion layer or a color filter, which converts the emitted white light to a preset color (or predetermined color), may be additionally provided.

As described above, according to the embodiments of the present invention, a TFT array substrate, an organic light-emitting display device including the substrate, and a method of manufacturing the organic light-emitting display device may be used to improve the quality of the display.

While the present invention has been particularly shown and described with reference to example embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting display device comprising:
a substrate;
a first element layer on the substrate and comprising a first thin film transistor (TFT);
a first planarization layer on the first element layer;
a second element layer on the first planarization layer and comprising a capacitor, the capacitor being electrically coupled to a gate of the first TFT; and
an organic light-emitting diode (OLED) on the second element layer and configured to be insulated from the second element layer.

2. The organic light-emitting display device of claim 1, further comprising:

a second planarization layer on the second element layer;
a third element layer on the second planarization layer and comprising a second TFT; and
a third planarization layer on the third element layer, wherein the second planarization layer, the third element layer, and the third planarization layer are between the second element and OLED.

3. The organic light-emitting display device of claim 2, wherein at least parts of the first element layer, second element layer, and third element layer are overlapped.

4. The organic light-emitting display device of claim 2, wherein the first TFT and the second TFT are of different types.

5. The organic light-emitting display device of claim 4, wherein the first TFT comprises an LTPS TFT and the second TFT comprises an oxide TFT.

6. The organic light-emitting display device of claim 2, further comprising an initializing power line and a driving power line,
wherein the capacitor comprises a first capacitor, the first capacitor comprising:
a first lower electrode on the first planarization layer and is coupled to the initializing power line;
a first dielectric layer on the first lower electrode; and
a first upper electrode on the first dielectric layer above the first lower electrode and is coupled to the driving power line.

7. The organic light-emitting display device of claim 6, wherein the first element layer comprises a first TFT, the first TFT comprising:
a first active layer on the substrate;
a first gate electrode coupled to the first lower electrode, and insulated from the first active layer by a first gate insulating layer;
a first source electrode insulated from the first gate electrode by a first interlayer insulating layer and coupled to the driving power line; and
a first drain electrode on a same layer as the first source electrode and coupled to the OLED.

8. The organic light-emitting display device of claim 7, further comprising a first scan line and a data line,
wherein the third element layer comprises a second TFT, the second TFT comprising:
a second active layer on the second planarization layer;
a second gate electrode that is coupled to the first scan line and insulated from the second active layer by a second gate insulating layer;
a second source electrode insulated from the second gate electrode by a second interlayer insulating layer and coupled to the data line; and
a second drain electrode on the same layer as the second source electrode and is coupled to the first source electrode.

9. The organic light-emitting display device of claim 7, further comprising a first scan line and a data line,
wherein, the third element layer comprises the second TFT, the second TFT comprising:
a second gate electrode on the second planarization layer and is coupled to the first scan line;
a second active layer insulated from the second gate electrode by the second gate insulating layer;
a second source electrode configured to contact the second active layer and to couple to the data line; and
a second drain electrode on the same layer as the second source electrode and coupled to the first source electrode.

10. The organic light-emitting display device of claim 8, wherein the first element layer comprises a third TFT, the third TFT comprising:
a third active layer on the same layer of the first active layer;
a third gate electrode on the same layer as the first gate electrode and coupled to the first scan line;
a third source electrode on the same layer as the first drain electrode and coupled to the first TFT; and
a third drain electrode the same layer as the first drain electrode and coupled to the first gate electrode.

11. The organic light-emitting display device of claim 10, further comprising a second scan line,
wherein the third element layer comprises a fourth TFT, the fourth TFT comprising:
a fourth gate electrode on a same layer as the second gate electrode and coupled to the second scan line;
a fourth active layer on the same layer as the second active layer;
a fourth source electrode on the same layer as the second drain electrode and coupled to the initializing power line; and
a fourth drain electrode on the same layer as the first drain electrode and coupled to the first gate electrode.

12. The organic light-emitting display device of claim 11, further comprising an emission control line,
wherein the first element layer comprises a fifth TFT, the fifth TFT comprising:
a fifth active layer on the same layer as the first active layer;
a fifth gate electrode on the same layer as the first gate electrode and coupled to the emission control line;
a fifth source electrode on the same layer as the first drain electrode and coupled to the driving power line; and
a fifth drain electrode on the same layer as the first source electrode and coupled to the first TFT.

13. The organic light-emitting display device of claim 12, wherein the third element layer comprises a sixth TFT, the sixth TFT comprising:
a sixth gate electrode on the same layer as the second gate electrode and coupled to the emission control line;
a sixth active layer on the same layer as the second active layer;
a sixth source electrode on the same layer as the first drain electrode and coupled to the first TFT; and
a sixth drain electrode on the same layer as the first drain electrode and coupled to the OLED.

14. The organic light-emitting display device of claim 8, wherein the capacitor further comprises a second capacitor, the second capacitor comprising:
a second lower electrode on the first planarization layer and coupled to the first gate electrode; and
a second upper electrode on the first dielectric layer and configured to correspond to the second lower electrode and to be coupled to the first scan line.

15. The organic light-emitting display device of claim 9, wherein the first element layer comprises a third TFT, the third TFT comprising:
a third active layer on the same layer of the first active layer;
a third gate electrode on the same layer as the first gate electrode and coupled to the first scan line;
a third source electrode on the same layer as the first drain electrode and coupled to the first TFT; and
a third drain electrode the same layer as the first drain electrode and coupled to the first gate electrode.

16. The organic light-emitting display device of claim 15, further comprising a second scan line,
wherein the third element layer comprises a fourth TFT, the fourth TFT comprising:

a fourth gate electrode on a same layer as the second gate electrode and coupled to the second scan line;

a fourth active layer on the same layer as the second active layer;

a fourth source electrode on the same layer as the second drain electrode and coupled to the initializing power line; and a fourth drain electrode on the same layer as the first drain electrode and coupled to the first gate electrode.

17. The organic light-emitting display device of claim 16, further comprising an emission control line, wherein the first element layer comprises a fifth TFT, the fifth TFT comprising:

a fifth active layer on the same layer as the first active layer;

a fifth gate electrode on the same layer as the first gate electrode and coupled to the emission control line;

a fifth source electrode on the same layer as the first drain electrode and coupled to the driving power line; and a fifth drain electrode on the same layer as the first source electrode and coupled to the first TFT.

18. The organic light-emitting display device of claim 17, wherein the third element layer comprises a sixth TFT, the sixth TFT comprising:

a sixth gate electrode on the same layer as the second gate electrode and coupled to the emission control line;

a sixth active layer on the same layer as the second active layer;

a sixth source electrode on the same layer as the first drain electrode and coupled to the first TFT; and a sixth drain electrode on the same layer as the first drain electrode and coupled to the OLED.

19. The organic light-emitting display device of claim 9, wherein the capacitor further comprises a second capacitor, the second capacitor comprising:

a second lower electrode on the first planarization layer and coupled to the first gate electrode; and a second upper electrode on the first dielectric layer and configured to correspond to the second lower electrode and to be coupled to the first scan line.

* * * * *